(12) United States Patent
Kim et al.

(10) Patent No.: US 11,201,757 B2
(45) Date of Patent: Dec. 14, 2021

(54) DEVICE AND CLOUD SERVER PROVIDING SAFETY SERVICE BY IDENTIFYING ELECTRIC HEATING DEVICE

(71) Applicant: LG ELECTRONICS INC., Seoul (KR)

(72) Inventors: Sang Won Kim, Seoul (KR); Seunghoe Choe, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 320 days.

(21) Appl. No.: 16/376,885

(22) Filed: Apr. 5, 2019

(65) Prior Publication Data

US 2019/0312749 A1 Oct. 10, 2019

(30) Foreign Application Priority Data

Apr. 6, 2018 (KR) .......................... 10-2018-0040541

(51) Int. Cl.
*H04L 12/28* (2006.01)
*G01R 11/52* (2006.01)
*H05B 1/02* (2006.01)

(52) U.S. Cl.
CPC .......... *H04L 12/2827* (2013.01); *G01R 11/52* (2013.01); *H05B 1/0252* (2013.01)

(58) Field of Classification Search
CPC .... H04L 12/2827; G01R 11/52; H05B 1/0252
See application file for complete search history.

(56) References Cited

U.S. PATENT DOCUMENTS

| 8,806,063 B1 * | 8/2014 | Kamath | G06F 1/12 709/248 |
| 10,650,621 B1 * | 5/2020 | King | H04L 67/10 |
| 2002/0101231 A1 * | 8/2002 | Staats | G01R 15/142 324/126 |

(Continued)

FOREIGN PATENT DOCUMENTS

KR 10-1555942 B1 9/2015

*Primary Examiner* — Tadesse Hailu
(74) *Attorney, Agent, or Firm* — Birch, Stewart, Kolasch & Birch, LLP

(57) ABSTRACT

A wireless electric power sensing device can include a communication unit configured to communicate with an external device; a measuring unit configured to measure power consumption information corresponding to a plurality of devices located within a target space; and a central control unit configured to detect a point in time when one or more square waves are included in the power consumption information, determine reactive power based the power consumption information, identify an electric heating device from among the plurality of devices within the target space based on a rate of change in the reactive power, determine when an operation time of the electric heating device exceeds a predetermined amount of time based on a change in the power consumption information, and in response to the operation time of the of the electric heating device exceeding the predetermined amount of time, transmit, via the communication unit, identification information for the electric heating device and information about the operation time of the electric heating device to the external device.

18 Claims, 10 Drawing Sheets

(56) References Cited

U.S. PATENT DOCUMENTS

| | | | |
|---|---|---|---|
| 2011/0202293 A1* | 8/2011 | Kobraei | G06Q 50/06 |
| | | | 702/62 |
| 2012/0068692 A1* | 3/2012 | Patel | G01R 15/202 |
| | | | 324/202 |
| 2016/0021704 A1* | 1/2016 | Elverud | H01B 1/24 |
| | | | 219/549 |
| 2016/0195864 A1* | 7/2016 | Kim | H04L 12/2816 |
| | | | 709/221 |
| 2016/0359325 A1* | 12/2016 | Kawata | G16H 50/20 |
| 2018/0269723 A1* | 9/2018 | Chen | H02J 50/12 |
| 2018/0295679 A1* | 10/2018 | Kwag | H05B 6/062 |
| 2020/0319621 A1* | 10/2020 | Roy | A61H 33/00 |

* cited by examiner

FIG. 8

| IDENTIFICATION INFORMATION ON ELECTRIC HEATING DEVICE | REACTIVE POWER | Step1 | safe_time_1 | Step2 | safe_time2 | Step3 | safe_time3 |
|---|---|---|---|---|---|---|---|
| HAIRDRYER | 50 | 1000 W | 10 min | 1100 W | 7 min | 1300 W | 4 min |
| COFFEE POT | 15 | 600 W | 20 min | | | | |
| HEATER | 35 | 1500 W | 30 min | 1700 W | 25 min | 1500 W | 15 min |
| TOASTER | 15 | 680 W | 15 min | 720 W | 10 min | | |

FIG. 10

| IDENTIFICATION INFORMATION ON WIRELESS ELECTRIC POWER SENSING DEVCIE | IDENTIFICATION INFORMATION ON ELECTRIC HEATING DEVCIE | REACTIVE POWER | Step1 | safe_time_1 | Step2 | safe_time2 | Step3 | safe_time3 |
|---|---|---|---|---|---|---|---|---|
| CT_SEN_01 | HAIRDRYER | 50 | 1000 W | 10 min | 1100 W | 7 min | 1300 W | 4 min |
| | COFFEE POT | 15 | 600 W | 20 min | | | | |
| CT_SEN_02 | HEATER | 35 | 1500 W | 30 min | 1700 W | 25 min | 1500 W | 15 min |
| | TOASTER | 15 | 680 W | 15 min | 720 W | 10 min | | |

DEVICE AND CLOUD SERVER PROVIDING SAFETY SERVICE BY IDENTIFYING ELECTRIC HEATING DEVICE

CROSS-REFERENCE TO RELATED APPLICATION

This application claims priority to and the benefit of Korean Patent Application No. 10-2018-0040541, filed in the Republic of Korea on Apr. 6, 2018, the disclosure of which is incorporated herein by reference in its entirety.

BACKGROUND

1. Field of the Invention

The present disclosure relates to a device and a cloud server providing safety services by identifying electric heating devices.

2. Description of Related Art

A home appliance in a house may be connected to a socket to be provided with electric energy, and, when it is disconnected from the socket or is turned off, it stops consuming energy. Electric heating devices among home appliances may consume a large amount of energy and may cause fire. Accordingly, devices that can turn off such electric heating devices when these types of electric heating devices fail or fall, or that can cut off electricity when the electric heating device overheats are provided in the electric device to reduce the risk of fire.

However, these types of devices mechanically cut off energy and might operate incorrectly. Additionally, such devices operate in the state where the electric heating device keeps operating to the extent that fire occurs. Accordingly, the devices may not prevent fire and ensure safety.

Against this backdrop, there is a need to develop technologies that may be used to confirm energy consumption and notify the energy consumption to the user at the right time. In Korean Patent No. 10-1555942, an energy measuring unit in which a measuring unit is integrally coupled in a distribution board is disclosed. However, in the related art, an algorithm for confirming energy consumption of an individual product is not disclosed. With the energy measuring unit, only changes in total energy consumption may be confirmed. Additionally, in the related art, a process or a specific configuration for confirming energy consumption of an electric heating device and notifying the energy consumption to the user is not disclosed.

Applying technologies for confirming the state of an electric heating device to each individual electric heating device is costly. Thus, in this specification, a configuration in which technologies for confirming the state of an electric heating device do not need to be applied to each electric heating device will be presented.

SUMMARY

The present disclosure provides a method that may effectively confirm states where electric heating devices are used, on the basis of information on electric power consumption of the devices.

The present disclosure may ensure safety by monitoring electric power consumption of electric heating devices and providing the information on electric power consumption of the electric heating devices to a smart device of the user when the electric heating devices are used even after a certain period of time, thereby making it possible to prevent fire.

Objectives of the present disclosure are not limited to what has been described. Additionally, other objectives and advantages that have not been mentioned may be understood from the following description and may be better understood from embodiments. Further, it will be understood that the objectives and advantages of the present disclosure may be realized via means and a combination thereof that are described in the appended claims.

In an embodiment, a wireless electric power sensing device includes a central control unit that can detect a point in time when square waves are generated from electric power consumption that is measured by a measuring unit, identify an electric heating device on the basis of a rate of change in reactive power and confirm whether the electric heating device is operating for a certain period of time on the basis of changes in electric power consumption.

In an embodiment, the wireless electric power sensing device includes a communication unit that can transmit identification information and information on operation time of the electric heating device to a smart device with which identification information of the smart device is registered in advance, when the central control unit confirms the electric heating device is operating even after a certain period of time.

In an embodiment, a cloud server includes a server control unit that can detect a point in time when square waves are generated on the basis of changes in electric power consumption transmitted by the wireless electric power sensing device, identify an electric heating device on the basis of a rate of change in reactive power and confirm whether the electric heating device is operating for a certain period of time on the basis of changes in electric power consumption.

In an embodiment, the cloud server includes a smart device communication unit that can transmit identification information and information on operation time of the electric heating device to a smart device with which identification information of the smart device is registered in advance, when the server control unit confirms the electric heating device is operating even after a certain period of time.

In embodiments, a sensing device can be installed in a distribution board or a distribution panel to confirm electric power consumption of electric heating devices in a building or a home, a state where the electric heating devices are used, and a period of time during which the electric heating devices are used.

In embodiments, a notification message can be transmitted to a smart device of the user to ensure safety, when the electric heating devices used by the user is on or keeps operating (e.g., when a heating device operates longer than expected).

Effects of the present disclosure are not limited to what has been mentioned. Additionally, various effects of the disclosure may be readily drawn by one having ordinary skill in the art from configurations of the present disclosure.

BRIEF DESCRIPTION OF THE DRAWINGS

FIG. 8 shows magnitude of reactive power consumption of each device and magnitude of active power consumption of each device according to an embodiment of the present disclosure.

FIG. 10 shows detail information on an electric heating device that is registered with a wireless electric power sensing device and information on the wireless electric power sensing device which is stored in a server control unit according to an embodiment of the present disclosure.

DETAILED DESCRIPTION

Figure 1:
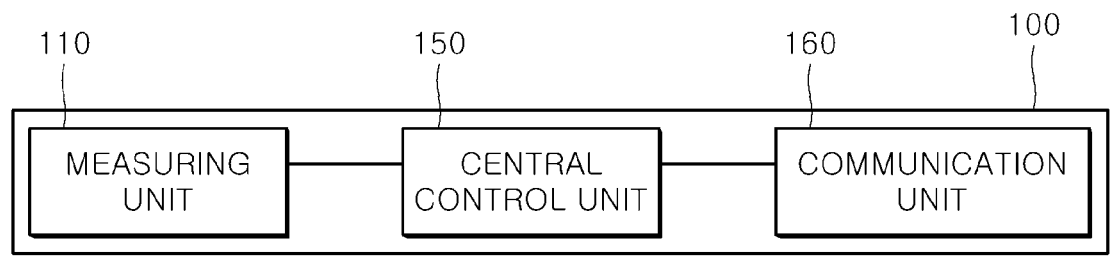
FIG. 1 shows a configuration of a wireless electric power sensing device according to an embodiment of the present disclosure.

Hereinafter, embodiments of the present disclosure will be described in detail with reference to the drawings so that those skilled in the art to which the present disclosure pertains can easily implement the present disclosure. The present disclosure may be implemented in many different manners and is not limited to the embodiments described herein.

In order to clearly illustrate the present disclosure, technical explanation that is not directly related to the present disclosure may be omitted, and same or similar components are denoted by a same reference numeral throughout the specification. Further, some embodiments of the present disclosure will be described in detail with reference to the drawings. In adding reference numerals to components of each drawing, the same components may have the same reference numeral as possible even if they are displayed on different drawings. Further, in describing the present disclosure, a detailed description of related known configurations and functions will be omitted when it is determined that it may obscure the gist of the present disclosure.

In describing components of the present disclosure, it is possible to use the terms such as first, second, A, B, (a), and (b), etc. These terms are only intended to distinguish a component from another component, and a nature, an order, a sequence, or the number of the corresponding components are not limited by that term. When a component is described as being "connected," "coupled" or "connected" to another component, the component may be directly connected or able to be connected to the other component; however, it is also to be understood that an additional component may be "interposed" between the two components, or the two components may be "connected," "coupled" or "connected" through an additional component.

Further, with respect to embodiments of the present disclosure, for convenience of explanation, the present disclosure may be described by subdividing an individual component, but the components of the present disclosure may be implemented within a device or a module, or a component of the present disclosure may be implemented by being divided into a plurality of devices or modules.

When it is identified that states where various electric heating devices (electric heating products) such as a heater, a hairdryer, an electric kettle, a toaster, an oven, an induction heater (for cooking), an electric heating mat, an electric iron, and the like in a building or in a house are operating, a state where energy is used may be confirmed on the basis of the states.

When each of the individual electric heating devices is connected with its own dedicated smart plug, energy consumption for each individual electric heating device can be sensed. However, in this situation, each individual electric heating device requires its own individual smart plug (e.g., many one-to-one relationships, which is cost prohibitive and burdensome).

In this specification, a configuration is disclosed in which energy consumption in a house can be confirmed by using a smart electric power meter that generates information on electric power consumption and that is installed in a distribution board, a power distribution panel, or circuit breaker panel. In this specification, a current transformer (CT) sensor (sensing unit) is disposed in or adjacent to a distribution board to sense information on the amount of electric power.

In an embodiment, a smart electric power meter that includes a CT sensor can sense a current value, multiply the current value by a fixed voltage value of supply voltage, transmit the multiplied value to a cloud server. The cloud server can identify devices and confirm individual energy consumption of each of the devices, using the transmitted electric power value and parameters that are stored in a database.

A sensed space or a target space denotes a space in a building or in a house or a designated area around a house or building (e.g., back yard), where a plurality of electronic devices are placed and the amount of electric power is sensed. A smart electric power meter is a device for smart electric power metering, which is provided in a distribution board that supplies electric power into the sensed space. The smart electric power meter is an embodiment element of the present disclosure and is referred to as a wireless electric power sensing device in this specification. The wireless electric power sensing device can wirelessly communicate with the outside (e.g., via the Internet).

In this specification, a wireless electric power sensing device in the distribution board in a building can automatically confirm the operation state (on/off) and electric power consumption of main electric heating products on the basis of information on total electric power consumption, such as main electric heating products that consume a large amount of power or the main contributors to the total power consumption. The wireless electric power sensing device can provide safety services by automatically confirming the state where main electric heating products (e.g., a heater, a hairdryer, an electric kettle, an oven, a toaster, and induction heater (for cooking), an electric heating mat, an electric iron, and the like) are on and by providing a notification to the user after a certain period of time (e.g. 5 min., when the products continue operating even after a certain period of time).

Additionally, the wireless electric power sensing device can apply different periods of time to different products based on the properties of each individual product, and can provide a notification when each product continues operating even after a certain period to time. For instance, an hour can be applied to an induction heater or an electric heating mat, and a notification can be provided when the operation time of the induction heater or the electric heating mat exceeds one hour, while a five hour time limit can be applied to other products, and a notification can be provided after those products have been operating for longer than five hours.

FIG. 1 shows a configuration of a wireless electric power sensing device according to an embodiment of the present disclosure. When an electric heating device starts to operate (e.g., On state), the wireless electric power sensing device 100 in FIG. 1 that is installed in the distribution board in a house automatically identifies or confirms the operating state where the electric heating device is on and provides a notification to a smart device of the user, based on information regarding total electric power consumption.

The wireless electric power sensing device 100 includes a measuring unit 110 that senses changes in states of electric energy currently supplied to a house or building through the distribution board and measures electric power consumption, a central control unit 150 that confirms the on/off state of a device and a rate of change (power factor) in active power and reactive power based on measured electric power consumption and is equipped with algorithm(s) for identifying the electric heating device, and a communication unit 160 that transmits information on a state or use of the identified electric heating device to an external smart device.

The measuring unit 110 can measure current values using generated inductive power. That is, the measuring unit 110 can be installed close to electric cables in the distribution board, sense electric current and generate current values. Additionally, the measuring unit 110 can perform high speed sampling based on a measuring cycle of 1 Hz or more.

The central control unit 150 can generate or determine a rate of change (power factor) of active power and reactive power, and identify an electric heating device based on the generated rate of change (e.g., specific rates of change can correspond to specific types of devices, and can be used to identify an individual device). Specifically, the central control unit 150 detects a point in time when square waves are generated from electric power consumption measured by the measuring unit 110, identifies an electric heating device based a rate of change in reactive power, and confirms whether the electric heating device has been operating for longer than a certain period of time based on changes in electric power consumption.

To this end, the central control unit 150 generates values of active power and a change in the amount of active power and reactive power and, when the change in the amount of active power and reactive power reaches a certain level (e.g., 15% or less or a power factor of 0.99 or less), the central control unit 150 identifies a given device as a specific type of electric heating device.

That is, the central control unit 150 identifies a device as an electric heating device when a rate of change in reactive power is at a certain level or below based on information on active power and reactive power of the total power consumption (e.g., the central control unit 150 can monitor the total power consumption of the home for specific changes or patterns, in order to single out specific devices). Additionally, the central control unit 150 can identify devices having value of active power similar to that of electric heating devices and notify the user that an electric heating device is on (e.g., in a situation in which the user leaves the oven on after leaving the house).

The central control unit 150 can measure active power and reactive power (power factor) based on total electric power consumption and identify an electric heating device using the measured active power and reactive power. The measuring unit 110, the central control unit 150, and the communication unit 160 in FIG. 2 can be installed as an embedded system.

In some embodiments, a cloud server can perform the same functions as the central control unit 150 and the communication unit 160. Description relating to this will be provided in description of FIG. 9.

The communication unit 160 transmits identification information on an electric heating device and information on operation time of the electric heating device to a smart device with which identification information of the smart device is registered in advance when the central control unit 150 confirms the electric heating device is operating even after a certain period of time. The user can confirm the state where the electric heating device is used through the smart device. The time at which a notification is sent varies from device to device or on the basis of operation steps of a device or may be set the same for all electric heating devices.

When a below-described cloud server in FIG. 9 identifies an electric heating device, the central control unit 150 can transmit information on electric power consumption that is measured in real time (or based on a very short period of time such as every second, and the like) as a transmission unit of a longer period of time (five sec. or ten sec.) to the cloud server. When the central control unit measures electric power consumption every second and transmits information on electric power consumption every five seconds, five pieces of information on electric power consumption can be transmitted from the wireless electric power sensing device 100 to the cloud server (300 in FIG. 9).

The wireless electric power sensing device 100 can sense current values. Current value and electric power value derived from the current value keep changing. In this process, the wireless electric power sensing device can calculate active power and reactive power and, based on the calculated active and reactive power, the wireless electric power sensing device can identify an individual electric heating device.

Figure 2:
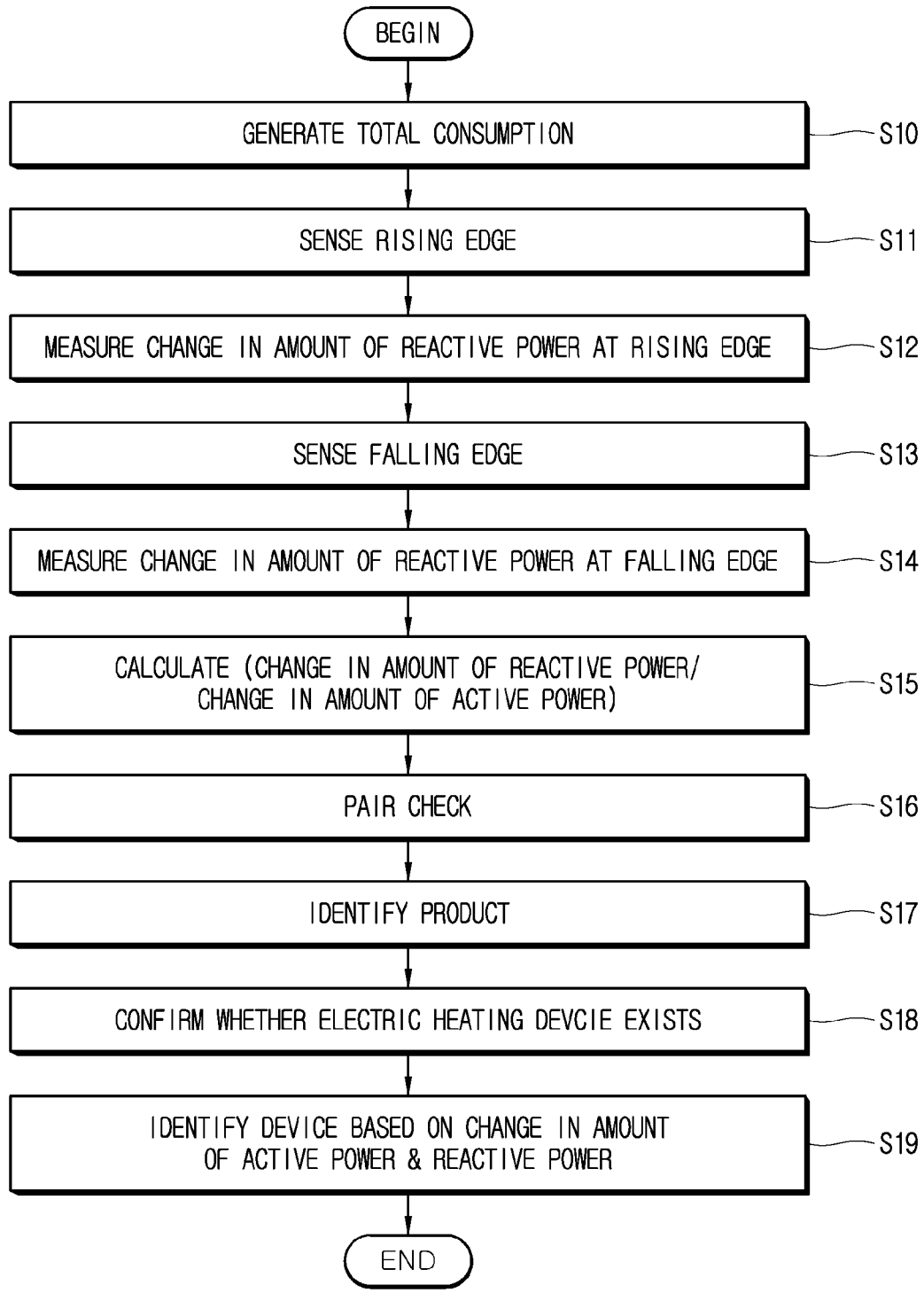
FIG. 2 shows a process of determining a state where an electric heating device is turned on according to an embodiment of the present disclosure.

FIG. 2 shows a process of determining a state where an electric heating device is turned on according to an embodiment of the present disclosure. The central control unit 150 generates total electric power consumption that is regularly measured by the measuring unit 110 (S10). In this situation, the central control unit 150 calculates active power and reactive power and then senses a rising edge based on changes in electric power consumption (S11).

The rising edge refers to a point in time when a specific device is turned on or starts to operate, or when energy consumption rises rapidly. That is, the rising edge means that total energy consumption rises perpendicularly or nearly perpendicularly. As an example, when square waves are on, that is, square waves rise, the central control unit 150 determines that the point in time when square waves rise (first point in time) is a point in time when a device is turned on or starts to operate. Then, when the central control unit monitors electric power consumption, and the monitored electric power consumption graph forms a square wave, the central control unit determines that the device that is turned on or is operating is an electric heating device. Next, the central control unit 150 can generate a rate of change in reactive power at the first point in time and identify an electric heating device based on the rate of change in reactive power.

Next, the central control unit 150 measures a change in the amount of reactive power at the time of rising edge (S12) and senses a falling edge (S13). The falling edge refers to a point in time when a specific device is turned off or stops operating, or when energy consumption falls rapidly. That is, the falling edge means that total energy consumption falls perpendicularly or nearly perpendicularly. The central control unit 150 measures a change in the amount of reactive power at the time of falling edge (S14), divides the change in the amount of reactive power by a change in the amount of active power and confirms a rate of change (S15).

Simply put, the central control unit 150 can detect the first point in time when square waves are changed ON from electric power consumption, and when a rate of change in reactive power is at a certain level or below, can identify an electric heating device that starts to operate at the first point in time.

Next, the central control unit performs a pair check (S16) and compares the magnitude of active power in a square wave with respect to detected electric power consumption and identifies a product (S17). Additionally, the central control unit determines whether electric energy consumed by an electric heating device is included in consumed electric energy (S18). This may be confirmed by calculating a rate of change in the amount of active power and reactive power from the detected square wave. Next, the central control unit 150 identifies a device based on a change in the amount of active power and reactive power (S19). Specifically, the central control unit 150 uses a change in the amount of reactive power between products of the same magnitude of active power to identify an individual electric heating device.

Figure 3:
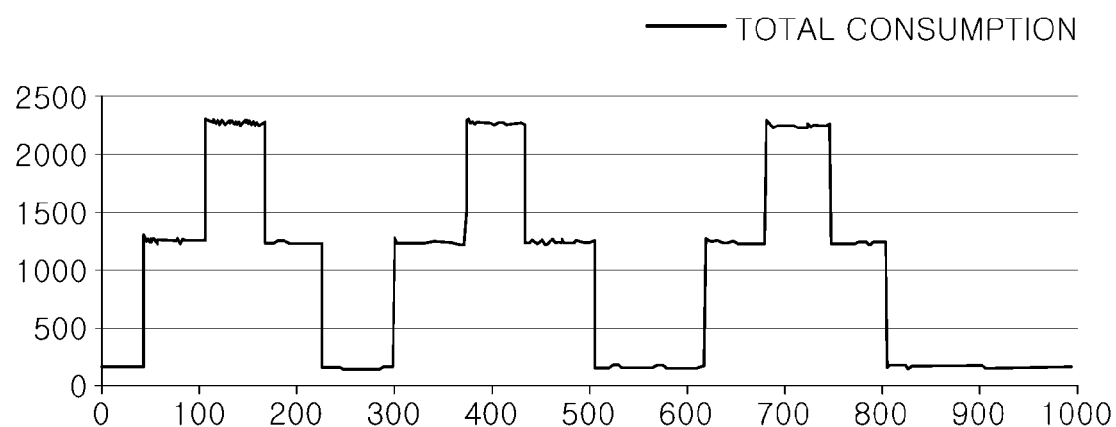
FIGS. 3 to 5 show changes in energy consumption according to an embodiment of the present disclosure.
Figure 4:
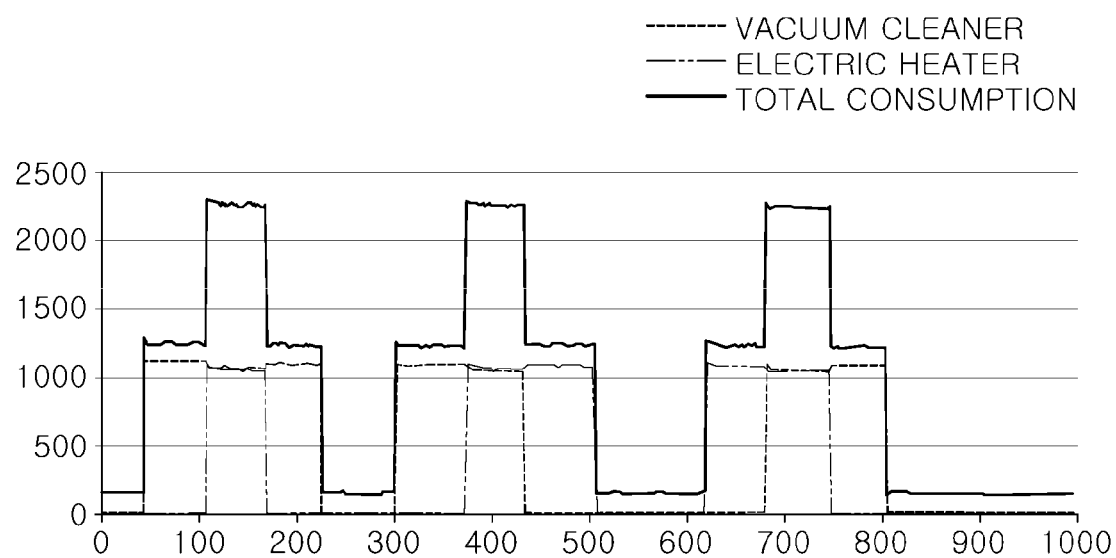
Figure 5:
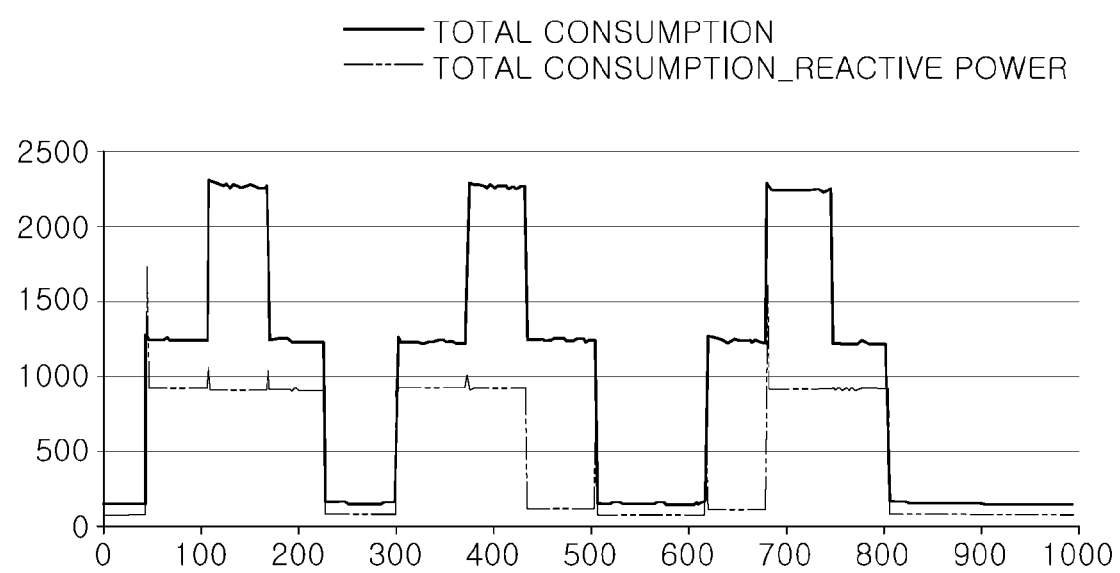

FIGS. 3 to 5 show changes in energy consumption according to an embodiment of the present disclosure. FIG. 3 illustrates a graph of total electric power consumption generated by the wireless electric power sensing device, FIG. 4 illustrates individual electric power consumption components of each of the vacuum cleaner and electric heater within the total electric power consumption of FIG. 3, and FIG. 5 illustrates reactive power in the total electric power consumption.

Referring to FIGS. 3 and 4, total electric power consumption increases while the vacuum cleaner and electric heater are operating. That is, based on the usage of the electric heater, when the vacuum cleaner is turned on or turned off, total electric power consumption increases. Referring to FIG. 5, when there is a change in the total electric power consumption or at the time when a specific device is turned on/off, there is a change in the magnitude of reactive power.

Referring to steps in FIGS. 3 to 5 and FIG. 2, the wireless electric power sensing device monitors reactive power in total electric power consumption, and, as illustrated in FIG. 5, the central control unit generates a change in the amount of reactive power respectively at the point in time when total electric power consumption rises (e.g., rising edge detected) and when total electric power consumption falls (e.g., falling edge detected) (S12 to S15 in FIG. 2).

As a result of generating the change in the amount of reactive power, the wireless electric power sensing device identifies a device where changes take place, such as a state where the device starts to operate or a state where the device is turned off, and the like, on the basis of a change in the amount of active power and reactive power and, in this process, the central control unit generates and confirms a rate of change in the amount of active power and reactive power from the detected square waves. Next, the central control unit 150 can identify a device based on a change in the amount of active power and reactive power (S19 in FIG. 2).

The step of identifying an electric heating device at the time when the electric heating device is turned on will be described. In order to identify an electric heating device, a step of registering an electric heating device is further included.

Figure 6:
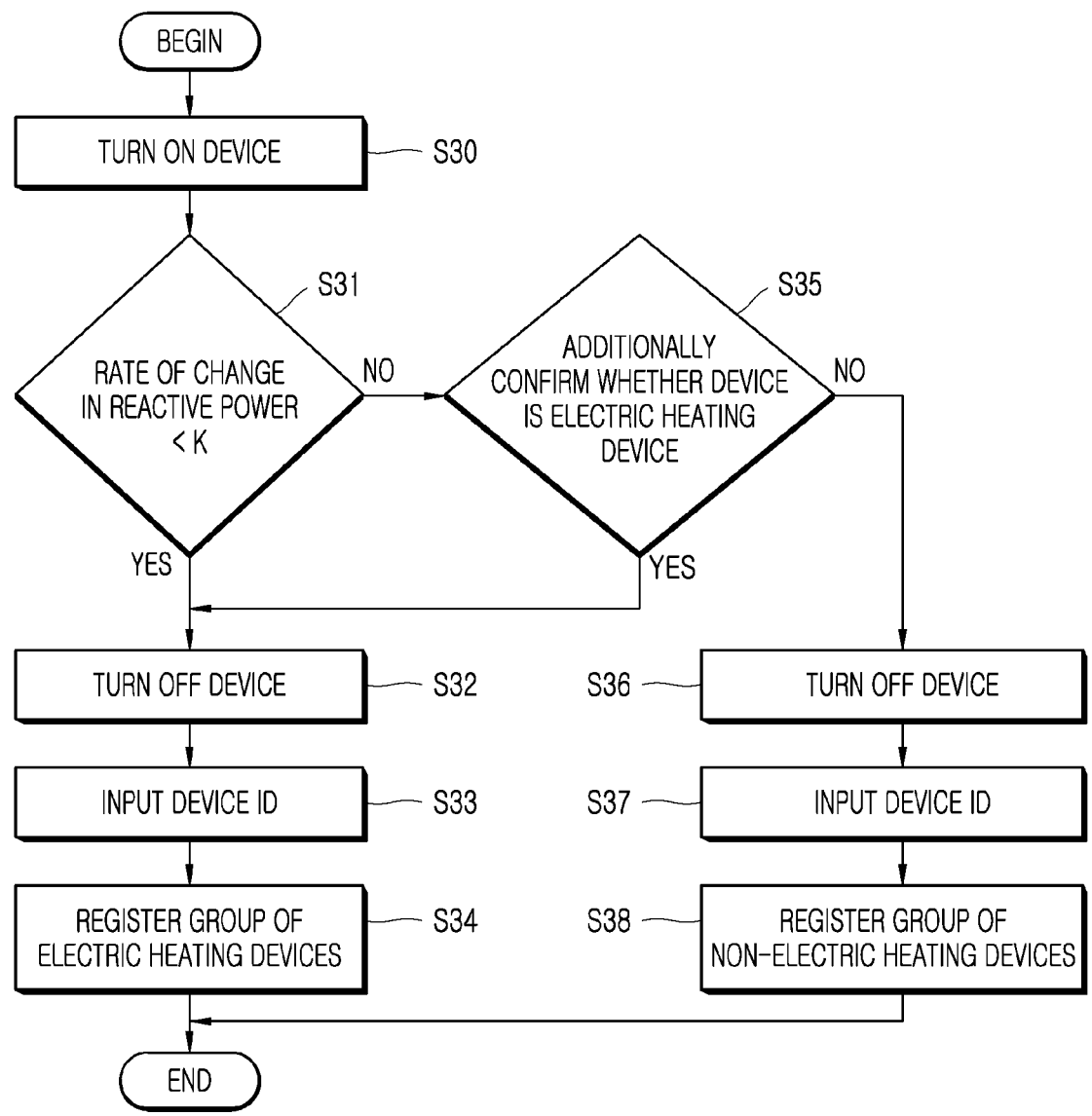
FIG. 6 shows a registration process in which a central control unit stores information on a device according to an embodiment of the present disclosure.

FIG. 6 shows a registration process in which a central control unit stores information on a device according to an embodiment of the present disclosure. When a device is turned on or starts to operate (S30), the central control unit 150 confirms a rate of change in reactive power and confirms that the rate of change in reactive power is at a reference value K (e.g., 10%) or less (S31).

When the rate of change in reactive power is lower than or equal to K, the central control unit identifies the device as an electric heating device and performs steps 32 to 34. Specifically, when a device is turned off (S32), the central control unit 150 controls the communication unit 160 to transmit a massage for requesting a smart device that is wirelessly connected with the central control unit in advance to input ID of the device that has been turned off, and thus, the user inputs identification information of the device on the smart device (S33).

The communication unit 160 delivers the input information to the central control unit 150, and the central control unit 150 stores the delivered identification information of the device (ID, name or sort, and the like) and information on power consumption of the device using a memory or a storage device therein (S34).

In step 32, when the rate of change in reactive power is more than or equal to K, the central control unit may have to additionally confirm whether the device is an electric heating device (for instance, when the rate of change in reactive power is more than or equal to K but lower than another reference value K', and the like) (S35). In this situation, the central control unit performs steps 32 to 34. As an example, an electric heating device such as a hairdryer, and the like consumes less electric power (low conversion of electric energy into thermal energy, such as low temperature, cold air, and the like).

When the central control unit does not need to additionally confirm whether the device is an electric heating device in step 35, registration of a non-electric heating device from step 36 to step 38 proceeds (e.g., non-electric heating devices can be identified, such as televisions, computers, lights, etc.). At the time when the appliance is turned off (S36), the central control unit 150 controls the communication unit 160 and transmits to a smart device that is connected with the central control unit in advance a message of requesting input of an ID of the appliance that has been turned off.

Accordingly, the user inputs identification information of the appliance on the smart device (S37). The input information is delivered to the central control unit 150 through the communication unit 160, and the central control unit 150 stores the delivered identification information on the non-electric heating device using a memory or a storing device therein (S38).

When an electric heating device is registered in FIG. 6, information on features of energy consumption of the electric heating device or on a period of time for which the electric heating device is used in a safe manner can be automatically or manually set. As in FIG. 8, a period of time for which an electric heating device is safely used can be set for each device.

Additionally, the central control unit stores information on active power or reactive power of each device. In this situation, value that is produced based on electric power consumption sensed by the central control unit 150 can be input to the central control unit in the process of inputting a device identifier. Then the central control unit 150 can search and identify an electric heating device that starts to operate at the first point in time (point in time when a square wave is on), using information on registered electric heating devices when a square wave is shown in the graph of electric power consumption as in FIGS. 3 to 5.

Figure 7:
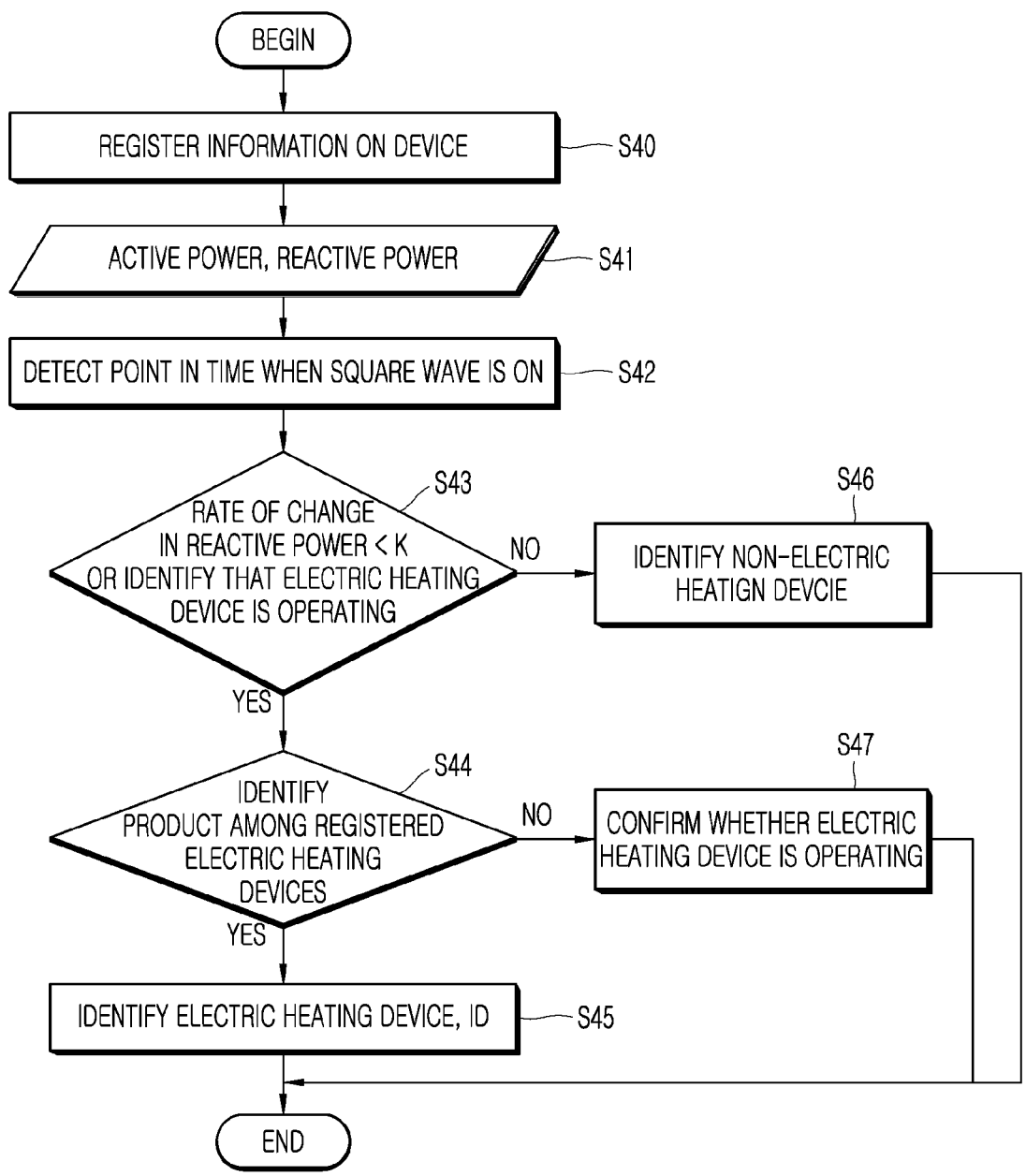
FIG. 7 shows an operation process of algorithm in which a central control unit identifies an electric heating device according to an embodiment of the present disclosure.

FIG. 7 shows an operation process for an algorithm in which a central control unit identifies an electric heating device according to an embodiment of the present disclosure. After a device is registered as in FIG. 6 (S40), the central control unit 150 calculates active power and reactive power from total consumption (S41).

Then the central control unit detects a point in time when square waves are on (S42). As a means to confirm changes in electric power consumption, squares waves may be used. When an electric heating device such as a heater, a fan heater, a vacuum cleaner, a hairdryer, a microwave oven, an electric kettle and a toaster is turned on, magnitude of electric power consumption changes in the form of a square wave.

When the rate of change in reactive power is lower than or equal to K (e.g. 10%) at the detected point in time or when an electric heating device is operating and a device to be detected is definitely an electric heating device at the detected point in time (S43), the central control unit 150 identifies which one of the electric heating devices that are registered in step 40 (the process of FIG. 6) is operating (S44), and identifies an electric heating device that is operating and identification information on the electric heating device (S45).

When the central control unit identifies a device as a non-electric heating device in step 43, the central control unit performs a routine of identifying a non-electric heating device (S46). In an embodiment, at the point in time when square waves are off, e.g., when energy consumption falls rapidly, the central control unit 150 can identify identification information on a product.

When the central control unit does not identify a device as a registered electric heating device in step 44, the central control unit confirms operation of the device as in FIG. 6 (S47). As in FIG. 6, the wireless electric-power sensing device 100 can request the smart device to confirm operation of an unregistered device to confirm whether the unregistered device is operating after the wireless electric power sensing device initially senses that the unregistered device operates. In this process, the wireless electric-power sensing device 100 can receive identification information of the device that is operating from the smart device and store the same through the process of FIG. 6.

Thus, in embodiments of the present disclosure, a state (e.g., the state where a device is turned on, the state where a device is operating) of each of the plurality of electric heating devices (e.g., each product) can be sensed based on information on total electric power consumption in the distribution board in a building, without a smart plug. The central control unit can automatically confirm whether a product is on at a point in time when the product, in particular, an electric heating device, is turned on, e.g., when the product is on and can provide a notification to the user when the device operates longer than a certain period of time (e.g., five minutes), e.g., when a certain period of time passes after the device is turned on (e.g., to notify the user of an unsafe situation, such as to remind the user that the stove has been left on, or a heating iron has been left on).

In FIG. 7, simply put, the central control unit 150 identifies an electric heating device that starts to operate at a certain point in time. The central control unit confirms a state of the electric heating device using various parameters, specifically, a state where a rate of change in reactive power is at a certain level or below, a state where electric heating devices are only registered, and the like, from the point in time when square waves are on. Additionally, the central control unit confirms the identified electric heating device keeps operating at the second point in time that is a reference point in time (a period of time for safe use) which is set at the first point in time in advance.

The central control unit can determine whether an electric heating device is operating on the basis of whether square waves fall between the first point in time and the second point in time, whether electric power consumption falls, and the like. The period of time for safe use is presented in FIG. 8. The period of time for safe use can be the same among electric heating devices or can vary from electric heating device to electric heating device. When two or more electric heating devices are operating, the central control unit 150 can increase and decrease the period of time for safe use.

In an embodiment, when two electric heating devices keep operating, the period of time for safe use may increase. This is the situation where the user is, in fact, using electric heating devices.

When two electric heating devices keep operating, the period of time for safe use may decrease. This is to consider safety of the user.

In the situation of a hairdryer that operates based on different stages or different settings, when electric power consumption of the hairdryer changes, the user can control the hairdryer to increase the period of time for safe use, thereby preventing a notification message from being delivered to the user.

As described above, the central control unit 150 can adjust the period of time for safe use that is used to decide to transmit a notification message based on properties of each electric heating device or based on a combination of properties of a plurality of electric heating devices.

FIG. 8 shows magnitude of reactive power consumption of each device and magnitude of active power consumption of each device according to an embodiment of the present disclosure.

For instance, reactive power of a hairdryer, a coffee pot, a heater and a toaster, active power of electricity consumed by the devices, and the like are presented in FIG. 8.

Step 1 denotes the magnitude of active power consumed by each of the devices. Step 1 can indicate basic operation or normal operation of each device. For instance, step 1 indicates air blowing by the hairdryer, boiling by the coffee pot, low-temperature heating by the heater, low-temperature toasting by the toaster, and the like.

Safe-time 1 is reference time that is used to transmit a notification message for safety services when a device operates in step 1. When the device keeps operating in step 1 even after the safe-time 1, the wireless electric power sensing device can transmit a notification message to a smart device.

Step 2 indicates operation (different magnitude of energy consumption) different from the basic or the normal operation in step 1, for instance, warm-air blowing by the hairdryer, medium-temperature heating by the heater, high-temperature toasting by the toaster, and the like. On the basis of step 2, safe-time 2 of each device can be determined.

Step 3 indicates operation (different magnitude of energy consumption) different from the operations in step 1 and step 2, for instance, hot-air blowing by the hairdryer, hot-temperature heating by the heater, and the like. On the basis of step 3, safe-time 3 of each device can be determined.

Safe-time 1, safe-time 2 and safe-time 3 can be set based on the type of each electric heating device, properties of the operation of each electric heating device, energy consumed by each electric heating device, and the like. Values of safe-time 1, safe-time 2 and safe-time 3 can be stored when electric heating devices are registered, or can be automatically set by the central control unit based on the types of electric heating devices.

In an embodiment, the wireless electric power sensing device transmits sensed information to a cloud server, and then the cloud server can confirm use of an electric heating device and can provide a notification service when the device is used even after a certain period of time.

Figure 9:
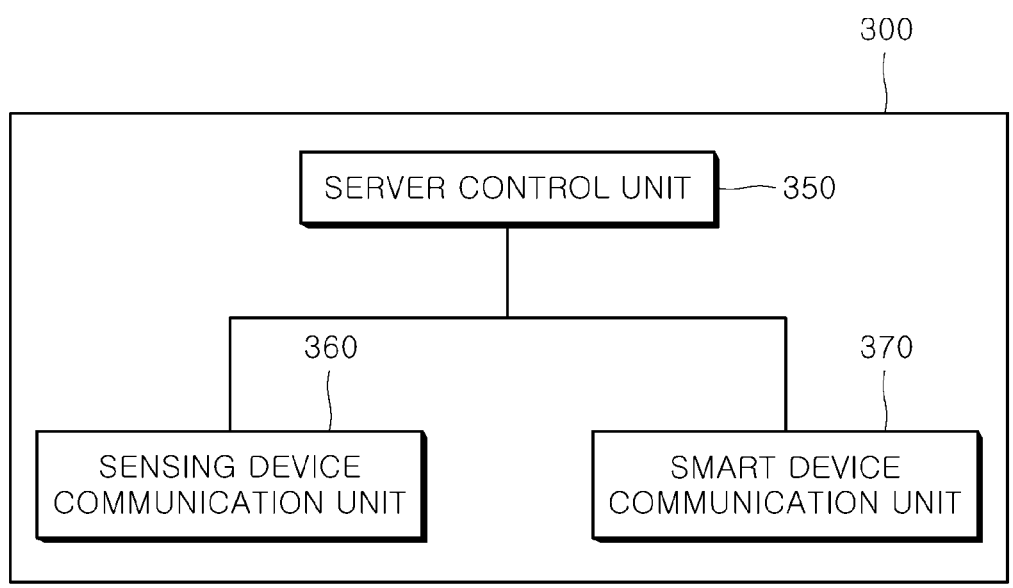
FIG. 9 shows a configuration of a cloud server according to an embodiment of the present disclosure.

FIG. 9 shows a configuration of a cloud server according to an embodiment of the present disclosure. The cloud server receives electric power consumption of electric heating devices from a plurality of wireless electric power sensing units, and the electric power consumption is measured every second or on the basis of a certain period of time (e.g., five sec., ten sec., and the like), and, on the basis of the electric power consumption, confirms whether the electric heating devices are operating in a target space where the wireless electric power sensing units are placed.

A sensing device communication unit 360 receives information on electric power consumption from the wireless electric power sensing unit 100. The wireless electric power sensing unit 100 can transmit information on electric power consumption per second to improve accuracy of sensing or can sense electric power consumption per second and transmit information on the electric power consumption per five seconds or per ten seconds.

A server control unit 350 detects a point in time when square waves are generated based on changes in electric power consumption, identifies an electric heating device based on a rate of change in reactive power, and confirms whether the electric heating device is operating for a certain period of time based on changes in electric power consumption. As an example, steps 11 to 19 in FIG. 2 are presented.

When the server control unit 350 confirms an electric heating device is operating and then the confirmed electric heating device continues operating even after a certain period of time has elapsed, a smart device communication unit 370 transmits to a smart device, with which identification information of the smart device is registered in advance, identification information on the electric heating device and information on operation time of the electric heating device.

The server control unit 350, as in FIG. 10, can store identification information on the wireless electric power sensing device 100, identification information on an electric heating device that is registered with the wireless electric power sensing device 100, and specific information (e.g., active power, reactive power, a period of time for safe use, and the like) on the wireless electric power sensing device and the electric heating device.

FIG. 10 shows detail information on an electric heating device that is registered with a wireless electric power sensing device and information on the wireless electric power sensing device which is stored in a server control unit according to an embodiment of the present disclosure.

FIG. 10 shows identification information (e.g., CT_SEN_01, CT_SEN_02) on a wireless electric power sensing device and on an electric heating device that is registered with the wireless electric power sensing device, and specific information (e.g., active power, reactive power, a period of time for safe use, and the like) on the same, which are stored in an example server control unit 350. The specific information is the same as that in FIG. 8 (e.g., FIG. 10 includes another column to identify the wireless electric power sensing devices in different homes or buildings).

As described above, the server control unit 350 detects a first point in time when square waves are on from electric power consumption and, when a rate of change in reactive power is at a certain level or below at the first point in time, identifies an electric heating device that starts to operate at the first time in point.

When the wireless electric power sensing device accumulates electric power consumption that is measured per second and transmits information on the accumulated electric power consumption per five seconds to the server control unit 350, the server control unit 350 can compare pieces of information on electric power consumption that are transmitted per five seconds to confirm square waves are on.

For instance, when the wireless electric power sensing device transmits information of "100|105|106|103|1503" during the first point in time, the server control unit can confirm pieces of the following information on electric power consumption, which can be transmitted every five seconds, to confirm whether the electric power consumption of "1503", transmitted as the last information on electric power consumption during the first point in time, denotes a temporary peak of electric power consumption or denotes square waves. When the wireless electric power sensing device transmits information of "1500|1590|1532|1521|1609" during the second point in time, the server control unit can confirm the point in time when square waves are on.

The server control unit 350 searches and identifies an electric heating device that starts to operate at the first point in time, using the stored information as in FIG. 10, among electric heating devices that are coupled to and registered with the wireless electric power sensing device. An electric heating device can be identified based on the stored information in FIG. 10 and magnitude of electric power consumption of each device. The server control unit 350 confirms whether the identified electric heating device is operating at the second point in time that is reference time which is set at the first point in time (point in time when square waves are on) in advance, using the information.

In an embodiment, the server control unit 350 accumulates and stores pieces of received information and confirms whether each electric heating device is using electric power even after the period of time for safe use thereof. The information can be set for each device. As in FIG. 10, a period of time for safe use may vary from device to device. Accordingly, the server control unit 350 determines a second point in time based on a period of time for safe use of a registered electric heating device.

Figure 11:
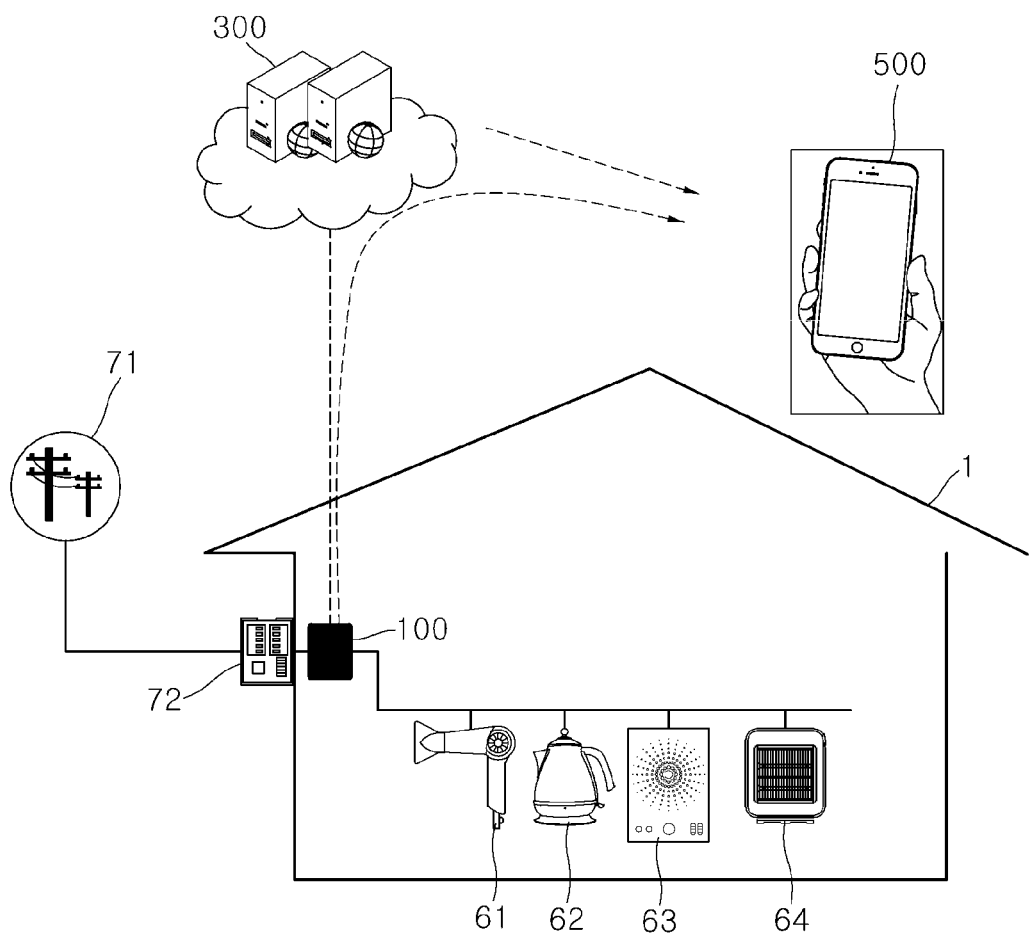
FIG. 11 shows a configuration of a wireless electric power sensing device and other home appliances according to an embodiment of the present disclosure.

FIG. 11 shows a configuration of a wireless electric power sensing device and other home appliances according to an embodiment of the present disclosure.

Electric energy that is provided by electricity companies 71 is supplied to a plurality of electric heating devices 61 to 64 through a distribution board 72 in a building 1. The electric heating devices are a hairdryer 61, a coffee pot 62, an induction oven 63, and a heater 64. The wireless electric power sensing device 100 can be placed in a distribution board 72 or placed near a distribution board 72.

The wireless electric power sensing device 100 can monitor a state of energy consumption of home appliances 61 to 64 in a building 72 and, on the basis of this, identify electric heating devices, or transmit information on electricity consumption to a cloud server 300 periodically, or in real time such that the cloud server 300 identifies electric heating devices based on the state of electricity consumption.

When an electric heating device is used even after a certain period of time, the wireless electric power sensing device 100 or the cloud server 300 confirms that the electric heating device is used even after a certain period of time and transmits information on the confirmation to a smart device 500 such that the user confirms safety of the electric heating device on the screen of the smart device.

A smart device 500 can include devices such as a smart phone, a tablet computer, a home automation device in a house, and the like that may communicate using Wi-Fi (wireless LAN) or Bluetooth. Information on the state where each electric heating device is used, transmitted by the wireless electric power sensing device 100 or the cloud server 300, can be confirmed on the screen of the communication devices.

The wireless electric power sensing device 100 or the cloud server 300 can store a point in time when each electric heating device is turned on such that the point in time when each electric heating device is turned on can be confirmed on the smart device 500.

The smart device 500 can output information on electric heating devices that are sensed by the wireless electric power sensing device 100, based on the provided information, such that the user confirms the output information.

In the configuration of FIG. 11, each home appliance 61 to 64 does not include a smart plug. Rather, an electric heating device can be automatically identified only with information on changes in total electric power consumption that is sensed by the wireless electric power sensing device 100.

When the smart device 500 confirms that an electric heating device is operating incorrectly, the user can select a quick stop mode on the smart device 500 to cut off electricity provided by the distribution board 72, thereby making it possible to prevent a fire caused by the electric heating device (e.g., in a situation where the user is on vacation or leaves for work, but accidently left the stove on or the iron on).

In an embodiment, a communication unit 160 can receive an instruction to start a quick stop mode that indicates an emergency power off directly from the smart device 500 or indirectly through the cloud server 300. The instruction can be transmitted in the form of a message.

The wireless electric power sensing device 100 can temporarily cut off electric power that is being provided from the distribution board 72 to the building 1 according to the transmitted message.

In embodiments, electric power consumption of each device does not need to be monitored because an electric heating device can be identified based on information on total consumption. To this end, the central control unit 150 or the server control unit 350 can generate information on a value of active power and a rate of change in the active power/a rate of change in reactive power of total consumption.

An electric heating device can be identified based on the generated information, and, when the electric heating device is used even after a certain period of time, a notification service can be provided through a smart device 500. The wireless electric power sensing device 100, the cloud server 300 and the smart device 500 can constitute home energy management systems (HEMS).

Although in embodiments, all the elements that constitute the embodiments of the present disclosure are described as being coupled to one or more embodiments or elements to operate, the disclosure is not limited to the embodiments. One or more of all the elements can be optionally coupled to operate within the scope of the present disclosure. Additionally, each of the elements can be implemented as single independent hardware, or some or all of the elements can be optionally combined and implemented as a computer program that includes a program module for performing some or all of the combined functions in single hardware or a plurality of hardware. Codes or segments that constitute the computer program may be readily inferred by one having ordinary skill in the art. The computer program is recorded on computer-readable media and read and executed by a computer to implement the embodiments. Storage media that store computer programs includes storage media magnetic recording media, optical recording media, and semiconductor recording devices. Additionally, the computer program that embodies the embodiments includes a program module that is transmitted in real time through an external device.

The embodiments of the present disclosure have been described. However, the embodiments may be changed and modified in different forms by one having ordinary skill in the art. Thus, it should be understood that the changes and modifications are also included within the scope of the present disclosure.

What is claimed is:

1. A wireless electric power sensing device, comprising:
a communication unit configured to communicate with an external device;
a measuring unit configured to measure power consumption information corresponding to a plurality of devices located within a target space; and
a central control unit configured to:
   detect a point in time when one or more square waves are included in the power consumption information,
   determine reactive power based on the power consumption information,
   identify an electric heating device from among the plurality of devices within the target space based on a rate of change in the reactive power,
   determine when an operation time of the electric heating device exceeds a predetermined amount of time based on a change in the power consumption information, and
   in response to the operation time of the electric heating device exceeding the predetermined amount of time, transmit, via the communication unit, identification information for the electric heating device and information about the operation time of the electric heating device to the external device,
wherein the central control unit is further configured to:
detect a first point in time when the one or more square waves begin based on the power consumption information, and
determine that the electric heating device starts to operate at the first point in time when the rate of change in the reactive power is less than or equal to a predetermined level at the first point in time.

2. The wireless electric power sensing device of claim 1, wherein the central control unit is further configured to:
search stored information for registered electric heating devices, and
retrieve the identification information corresponding to the electric heating device that starts to operate at the first point in time based on the stored information for the registered electric heating devices.

3. The wireless electric power sensing device of claim 2, wherein the central control unit is further configured to:

determine when the electric heating device is operating at a second point in time that is a reference time set in advance based on the first point in time.

4. The wireless electric power sensing device of claim 3, wherein the central control unit is further configured to: set the second point in time based on a period of time for safe use of the electric heating device.

5. The wireless electric power sensing device of claim 1, wherein the central control unit identifies the electric heating device based on a comparison between a magnitude of active power corresponding to the one or more square waves and stored magnitudes of active power, or a comparison between a magnitude of reactive power corresponding to the one or more square waves and stored magnitudes of reactive power.

6. The wireless electric power sensing device of claim 1, wherein the electric heating device includes a heater, a hairdryer, an electric kettle, a toaster, an oven, an induction heater, an electric stove, an electric heating mat or an electric iron.

7. The wireless electric power sensing device of claim 1, wherein the external device includes a smart device, a mobile terminal, a tablet computer, a smart phone, or a home energy management system (HEMS).

8. The wireless electric power sensing device of claim 1, wherein the operation time of the electric heating device is determined based on a rising edge of the one or more square waves and a falling edge of the one or more square waves.

9. The wireless electric power sensing device of claim 1, wherein the target space is a home or a building, and
wherein the wireless electric power sensing device is configured to be installed within or adjacent to a power distribution panel in the home or the building.

10. The wireless electric power sensing device of claim 1, wherein the identification information for the electric heating device and the information about the operation time of the electric heating device are included within a notification message for the external device.

11. The wireless electric power sensing device of claim 1, wherein the predetermined amount of time corresponds to an amount of time during which the electric heating device is safely operated, an average operating time of the electric heating device, or a normal operating time of the electric heating device.

12. A cloud server, comprising:
a communication unit configured to communicate with an external device and a wireless electric power sensing device; and
a server control unit configured to:
receive, via the communication unit, power consumption information from the wireless electric power sensing device, the power consumption information corresponding to a plurality of devices located within a target space,
detect a point in time when one or more square waves are included in the power consumption information,
determine reactive power based on the power consumption information,
identify an electric heating device from among the plurality of devices within the target space based on a rate of change in the reactive power,
determine when an operation time of the electric heating device exceeds a predetermined amount of time based on a change in the power consumption information, and
in response to the operation time of the electric heating device exceeding the predetermined amount of time, transmit, via the communication unit, identification information for the electric heating device and information about the operation time of the electric heating device to the external device,
wherein the server control unit is further configured to:
detect a first point in time when the one or more square waves begin based on the power consumption information, and
determine that the electric heating device starts to operate at the first point in time when the rate of change in the reactive power is less than or equal to a predetermined level at the first point in time.

13. The cloud server of claim 12, wherein the server control unit is further configured to:
search stored information for registered electric heating devices, and
retrieve the identification information corresponding to the electric heating device that starts to operate at the first point in time based on the stored information for the registered electric heating devices.

14. The cloud server of claim 13, wherein the server control unit is further configured to:
determine when the electric heating device is operating at a second point in time that is a reference time set in advance based on the first point in time.

15. The cloud server of claim 14, wherein the server control unit is further configured to:
set the second point in time based on a period of time for safe use of the electric heating device.

16. The cloud server of claim 12, wherein the communication unit includes a sensing device communication unit for communicating with the wireless electric power sensing device and a smart device unit for communicating with the external device.

17. The cloud server of claim 12, wherein the operation time of the electric heating device is determined based on a rising edge of the one or more square waves and a falling edge of the one or more square waves.

18. A wireless electric power sensing device, comprising:
a communication unit configured to communicate with an external device;
a measuring unit configured to measure power consumption information corresponding to a plurality of devices located within a target space; and
a central control unit configured to:
detect a point in time when one or more square waves are included in the power consumption information,
determine reactive power based on the power consumption information,
identify an electric heating device from among the plurality of devices within the target space based on a rate of change in the reactive power,
determine when an operation time of the electric heating device exceeds a predetermined amount of time based on a change in the power consumption information, and
in response to the operation time of the electric heating device exceeding the predetermined amount of time, transmit, via the communication unit, identification information for the electric heating device and information about the operation time of the electric heating device to the external device,
wherein the central control unit identifies the electric heating device based on a comparison between a magnitude of active power corresponding to the one or more square waves and stored magnitudes of active power, or a comparison between a magnitude of reactive power corresponding to the one or more square waves and stored magnitudes of reactive power.

\* \* \* \* \*